(12) United States Patent
Lam et al.

(10) Patent No.: US 11,990,195 B2
(45) Date of Patent: May 21, 2024

(54) SEMICONDUCTOR DEVICE WITH SELECTIVE COMMAND DELAY AND ASSOCIATED METHODS AND SYSTEMS

(71) Applicant: Lodestar Licensing Group LLC

(72) Inventors: Boon Hor Lam, Boise, ID (US); Shawn M. Hilde, Meridian, ID (US); Karl L. Major, Boise, ID (US); Garrett Harwell, Meridian, ID (US)

( * ) Notice: Subject to any disclaimer, the term of this patent is extended or adjusted under 35 U.S.C. 154(b) by 0 days.

(21) Appl. No.: 17/935,057

(22) Filed: Sep. 23, 2022

(65) Prior Publication Data

US 2023/0014661 A1    Jan. 19, 2023

Related U.S. Application Data (62) Division of application No. 16/839,371, filed on Apr. 3, 2020, now Pat. No. 11,468,960.

(60) Provisional application No. 62/955,701, filed on Dec. 31, 2019.

(51) Int. Cl.
  *G11C 29/12* (2006.01)
  *G11C 7/10* (2006.01)
  *G11C 11/406* (2006.01)
  *G11C 29/14* (2006.01)
  *G11C 29/44* (2006.01)

(52) U.S. Cl.
  CPC ...... *G11C 29/12015* (2013.01); *G11C 7/1048* (2013.01); *G11C 11/40615* (2013.01); *G11C 29/14* (2013.01); *G11C 29/44* (2013.01)

(58) Field of Classification Search
  CPC .......................... G11C 29/12015; G11C 29/44
  See application file for complete search history.

(56) References Cited

U.S. PATENT DOCUMENTS

| | | | |
|---|---|---|---|
| 4,887,240 A | 12/1989 | Garverick et al. | |
| 6,044,026 A | 3/2000 | Morgan | |
| 10,140,027 B1 | 11/2018 | Canepa et al. | |
| 2003/0126530 A1 | 7/2003 | Larson et al. | |
| 2003/0135699 A1 | 7/2003 | Matsuzaki et al. | |
| 2006/0039227 A1 | 2/2006 | Lai et al. | |

(Continued)

OTHER PUBLICATIONS

International Search Report and Written Opinion dated Feb. 26, 2021 for PCT Patent Application No. PCT/US2020/060059, 11 pages.

*Primary Examiner* — Douglas King
(74) *Attorney, Agent, or Firm* — Holland & Hart LLP (57) ABSTRACT

Memory devices, systems including memory devices, and methods of operating memory devices are described, in which memory device are configured to add variable delays to a command. The variable delays may be provided by a host device (e.g., a test equipment) using a test mode of the memory devices. Alternatively, the variable delays may be stored in nonvolatile memory (NVM) components of the memory devices. Further, mode registers of the memory devices may be set to indicate that the command is associated with the variable delays stored in the NVM components. Further, the memory devices may include delay components configured to add the variable delays to the command. Such variable delays facilitate staggered execution of the command across multiple memory devices so as to avoid (or mitigate) issues related to an instantaneous, large amount of current drawn from a power supply connected to the memory devices.

8 Claims, 7 Drawing Sheets

(56) References Cited

U.S. PATENT DOCUMENTS

| | | |
|---|---|---|
| 2007/0083800 A1 | 4/2007 | Laberge |
| 2007/0279112 A1 | 12/2007 | Maeda et al. |
| 2008/0028136 A1 | 1/2008 | Schakel et al. |
| 2008/0094932 A1 | 4/2008 | Park et al. |
| 2008/0253205 A1 | 10/2008 | Park et al. |
| 2008/0288716 A1* | 11/2008 | Arakawa ............. G06F 12/0246 |
| | | 711/E12.008 |
| 2014/0068218 A1* | 3/2014 | Iemura .................. G06F 3/0674 |
| | | 711/E12.001 |
| 2014/0362653 A1 | 12/2014 | Iwasaki |
| 2015/0356048 A1* | 12/2015 | King ................... G06F 13/1626 |
| | | 710/308 |
| 2016/0336060 A1 | 11/2016 | Shin |
| 2017/0053711 A1 | 2/2017 | Shibata |
| 2017/0118048 A1 | 4/2017 | Ulrich |
| 2019/0215199 A1 | 7/2019 | Hollis et al. |
| 2019/0278511 A1 | 9/2019 | Lee et al. |
| 2021/0202023 A1 | 7/2021 | Lam et al. |

* cited by examiner

SEMICONDUCTOR DEVICE WITH SELECTIVE COMMAND DELAY AND ASSOCIATED METHODS AND SYSTEMS

CROSS-REFERENCE TO RELATED APPLICATION

This application is a divisional of U.S. patent application Ser. No. 16/839,371, filed Apr. 3, 2020, which claims the benefit of U.S. Provisional Application No. 62/955,701, filed Dec. 31, 2019; which are incorporated herein by reference in their entirety.

TECHNICAL FIELD

The present disclosure generally relates to semiconductor devices, and more particularly relates to a semiconductor device with a selective command delay and associated methods and systems

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and nonvolatile memory. Volatile memory, including random-access memory (RAM), static random-access memory (SRAM), dynamic random-access memory (DRAM), and synchronous dynamic random-access memory (SDRAM), among others, require a source of applied power to maintain its data. Nonvolatile memory, by contrast, can retain its stored data even when not externally powered. Nonvolatile memory is available in a wide variety of technologies, including flash memory (e.g., NAND and NOR), phase change memory (PCM), ferroelectric random-access memory (FeRAM), resistive random-access memory (RRAM), and magnetic random-access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Multiple memory devices may be arranged to share a common power supply in a memory module (e.g., a dual in-line memory module (DIMM), a high bandwidth memory (HBM) module, a group of memory devices coupled to a test equipment configured for parallel testing). A quantity of memory devices sharing the power supply may increase for various reasons—e.g., to increase a memory capacity of an HBM module, to increase efficiency of resources shared in a parallel testing environment—while the power supply may be configured to provide a finite amount of power (e.g., a finite amount of current drawn therefrom) at any given time. Certain operations of the memory devices (e.g., operations associated with a refresh command, a precharge command, or an activate command, respectively) may draw a relatively greater amount of current from the power supply than other operations (e.g., read operations, write operations). As such, when the multiple memory devices concurrently perform such an operation, the power supply may not be able to supply a requisite amount of current to each memory devices, which may hinder proper execution of the operation by the multiple memory devices—e.g., inaccurate speed testing of memory devices, HBM modules failing to satisfy power and/or speed specifications.

Several embodiments of the present technology are directed to a memory device, systems including the memory device, and methods of operating the memory device in which the memory device is configured to introduce variable delays for a set of selected commands. As set forth herein, the memory device may include a delay component that may be programmed to cause a variable delay for a command to execute at the memory device. A particular amount of delay for a command may be based on several factors, such as an operating environment (e.g., a testing environment where the memory device is tested in parallel with additional memory devices, a native environment where the memory device performs a task requested by a host device (e.g., a memory controller, a processor) together with additional memory devices), an order of the memory device executing the command with respect to other memory devices in the operating environment, operating characteristics of the command, configurations of the power supply coupled to the memory device (and additional memory devices), among others. Further, the memory device may bypass (or deactivate) the delay component so as not to incur any delay for the command, in some cases.

Figure 3:
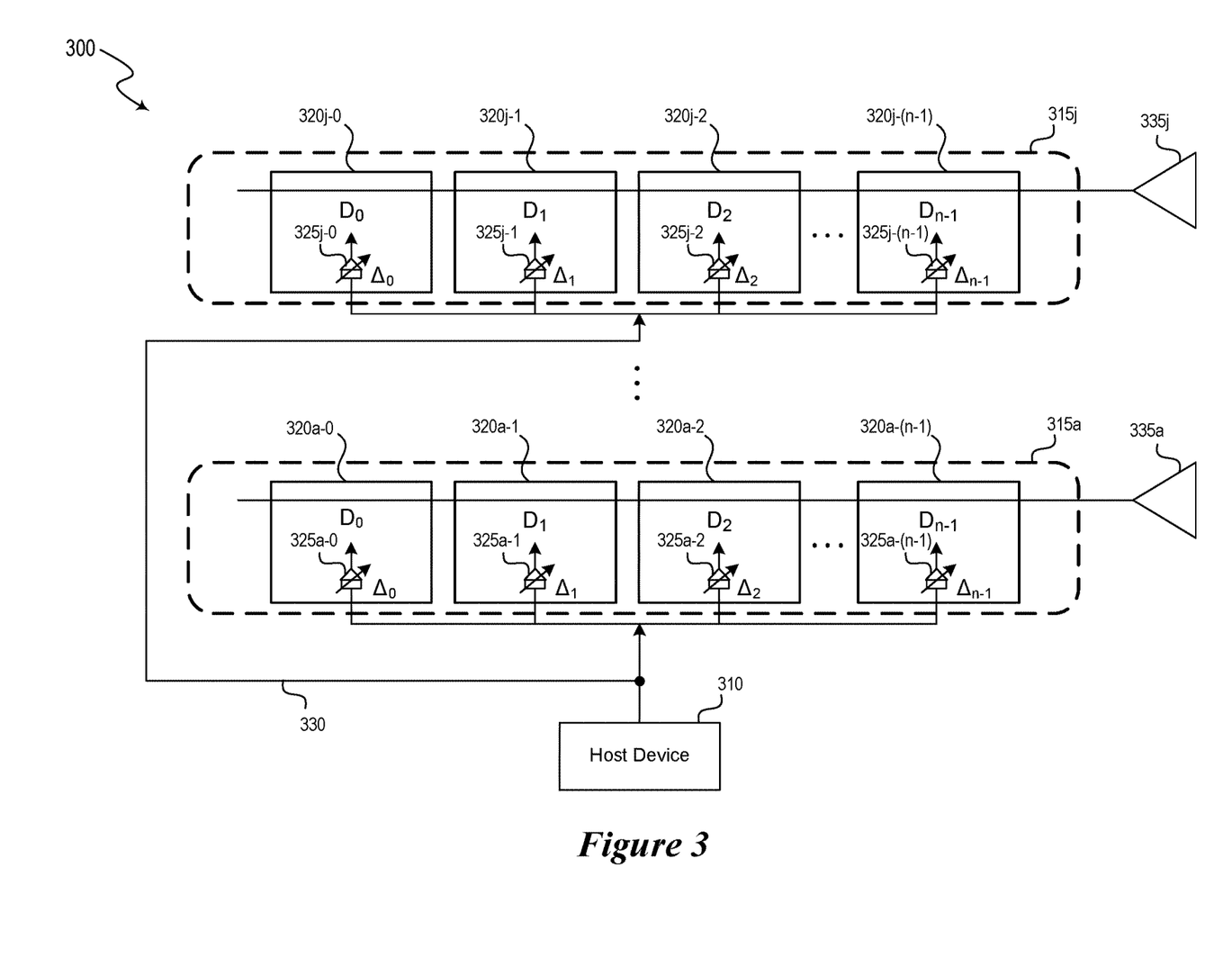
FIG. 3 shows a block diagram illustrating a scheme of introducing variable delays to a command directed to memory devices in a system in accordance with an embodiment of the present technology.
Figure 4:
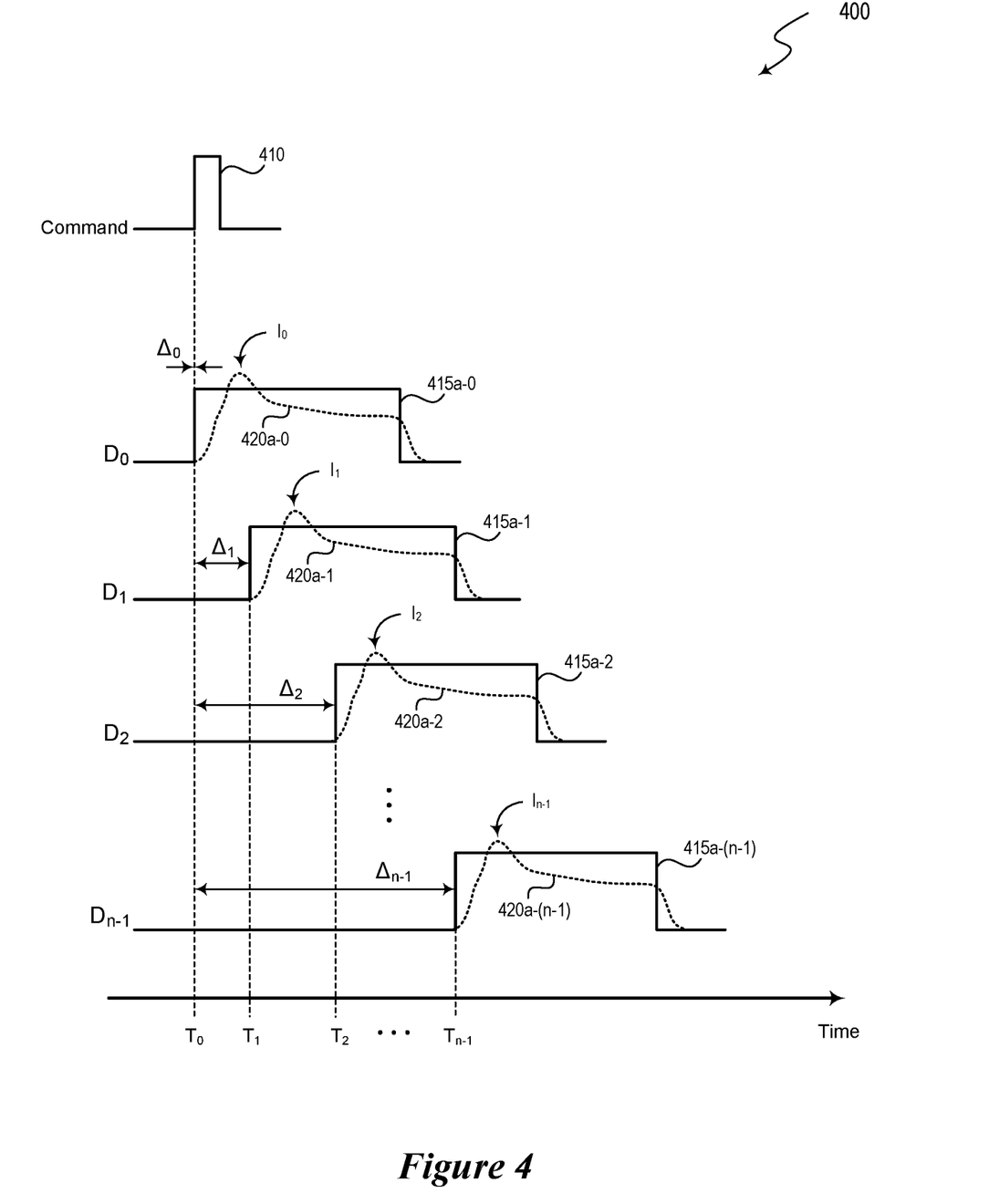
FIG. 4 shows a timing diagram illustrating a scheme of introducing variable delays to a command directed to memory devices in a system in accordance with an embodiment of the present technology.

A memory device that supports an embodiment of the present technology is described with reference to FIG. 1. More detailed descriptions of the memory device (e.g., a command decoder configured to selectively add variable delays to one or more commands) are provided with reference to FIG. 2. FIG. 3 illustrates a scheme of introducing variable delays to a command for such memory devices in an operating environment (e.g., a testing environment, a native environment). FIG. 4 describes various timings for such memory devices executing a command based on the variable delays in accordance with an embodiment of the present technology. A memory system that supports an embodiment of the present technology is described with reference to FIG. 5. Flowcharts illustrating methods of operating the memory device are described with reference to FIGS. 6 and 7.

Figure 1:
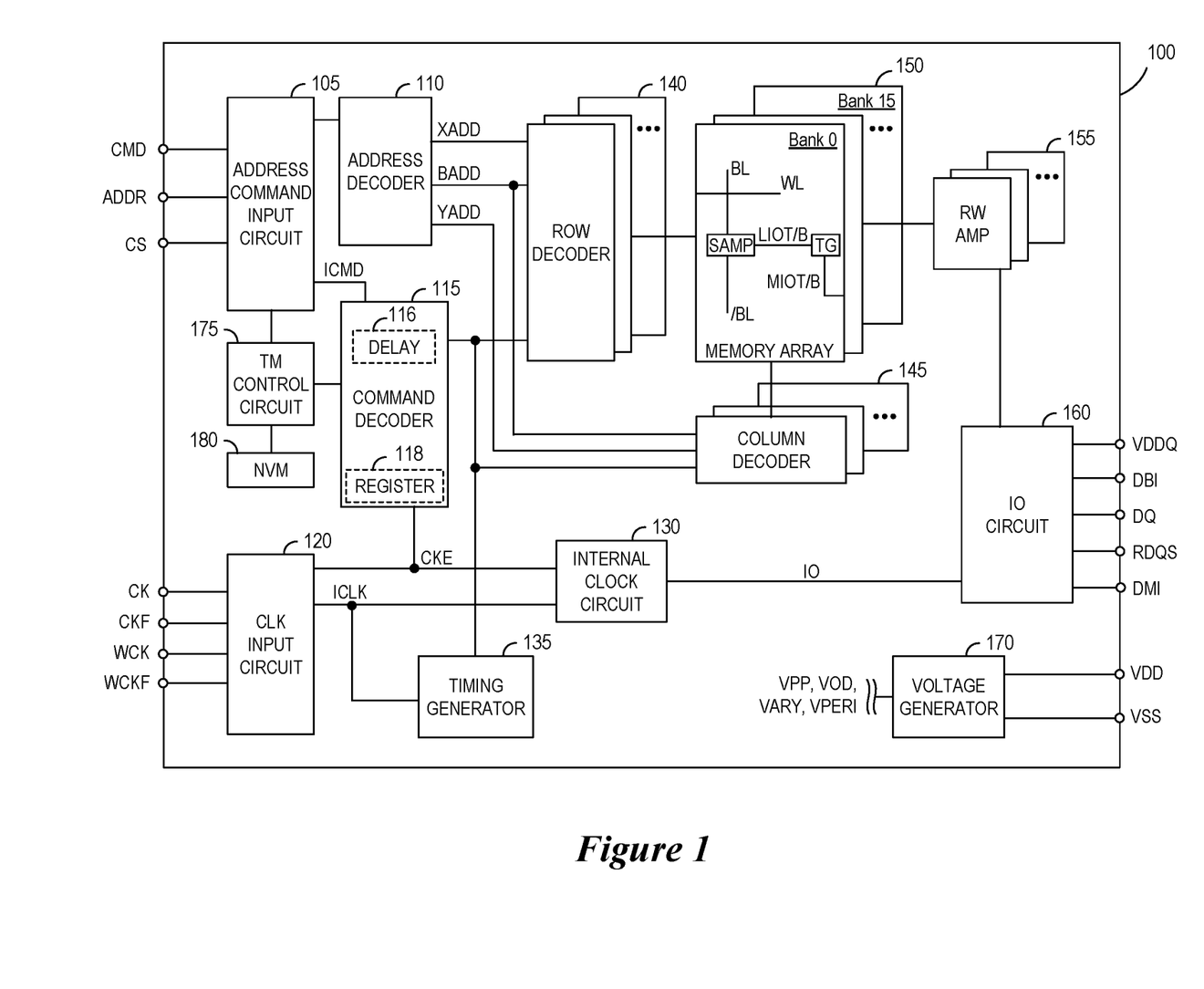
FIG. 1 is a block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). Memory cells can include any one of a number of different memory media types, including capacitive, phase change, magnetoresistive, ferroelectric, or the like. In some embodiments, a portion of the memory array 150 may be configured to store ECC parity bits. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140 (which may be referred to as a row driver), and a decoded column address signal (YADD) to the column decoder 145 (which may be referred to as a column driver). The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., refresh commands, activate commands, precharge commands, access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105.

The command decoder 115 may include circuits to decode the internal command signals ICMD to generate various internal signals and commands for performing memory operations, for example, a row command signal to select a word line and a column command signal to select a bit line. Other examples of memory operations that the memory device 100 may perform based on decoding the internal command signals ICMD includes a refresh command (e.g., re-establishing full charges stored in individual memory cells of the memory array 150), an activate command (e.g., activating a row in a particular bank, in some cases for subsequent access operations), or a precharge command (e.g., deactivating the activated row in the particular bank). The internal command signals can also include output and input activation commands, such as clocked command CMDCK (not shown in FIG. 1).

The command decoder 115, in some embodiments, may further include one or more registers 118 for tracking various counts and/or values (e.g., counts of refresh commands received by the memory device 100 or self-refresh operations performed by the memory device 100) and/or for storing various operating conditions for the memory device 100 to perform certain functions, features, and modes (or test modes). As such, in some embodiments, registers 118 (or a subset of the registers 118) may be referred to as mode registers. For example, the memory device 100 may be placed into a test mode by programming certain bits of the registers 118. In some embodiments, such a test mode may be used only by the manufacturer of the memory device 100, not by an end user. Further, the memory device 100 may implement such a test mode in conjunction with (or as part of) a design-for-test (DFT) method. In some cases, the DFT method may facilitate efficient parallel testing of multiple memory devices in a highly parallel testing environment. Additionally, or alternatively, the DFT method may mitigate risks associated with drawing too much current from a power supply coupled with an HBM module including multiple memory devices. In this regard, the memory device 100 may include a test mode (TM) control circuit 175 configured to manage various aspects of the test mode operations and/or to support the DFT method.

In some embodiments, the command decoder 115 may include one or more delay components 116 configured to introduce variable delays to certain selected commands— e.g., refresh commands, precharge commands, activate commands. The memory device 100 may program the delay components 116 with the variable delays, which may be based on operating conditions defined by the test mode (or the DFT method) such that the selected set of commands can be executed after the variable delays expire.

In some cases, the manufacturer of the memory device 100 may provide different delays for a command (e.g., a precharge command) to different memory devices (e.g., during a parallel testing procedure) such that individual memory devices may execute the command at different times—e.g., a staggered execution of the command across different memory devices 100. In some cases, the memory device 100 may store a particular value of a delay for a command (e.g., a refresh command) in a nonvolatile memory (NVM) component 180 of the memory device 100, which may include an array of fuses (or anti-fuses). The particular value of the delay may have been determined, for example, using the test mode and/or the DFT method, based on testing the memory device 100 together with other memory devices—e.g., in a tester socket configured to test a group of memory devices in parallel—to determine an optimum value of the delay for the command. Subsequently, the memory device 100 may, in conjunction with the TM control circuit 175, retrieve the particular value of the delay from the NVM component 180—e.g., during an initialization procedure for the memory device 100—to program the delay component to include the delay. As such, the memory device 100 can execute the command in the native environment (e.g., in the HBM module) in a staggered manner (e.g., multiple memory devices executing the command at different times) based on the particular value of the delay that has been determined and stored in the NVM component 180.

When a read command is issued to a bank with an open row and a column address is timely supplied as part of the read command, read data can be read from memory cells in the memory array 150 designated by the row address (which may have been provided as part of the activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

Figure 2:
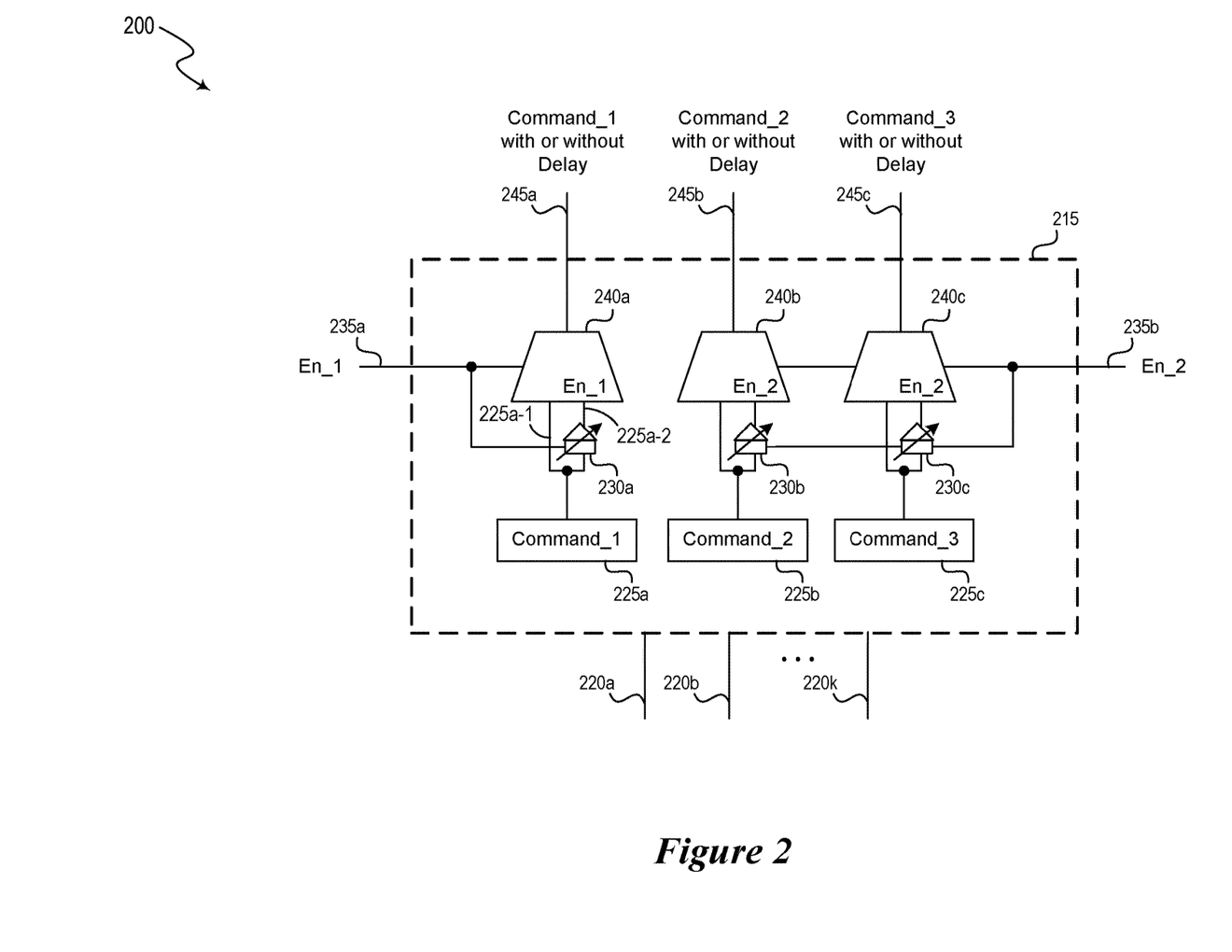
FIG. 2 is a block diagram schematically illustrating a command decoder of a memory device in accordance with an embodiment of the present technology.

FIG. 2 is a block diagram 200 schematically illustrating a command decoder of a memory device (e.g., the memory device 100) in accordance with an embodiment of the present technology. The diagram 200 includes a command decoder 215, which may be an example of or include aspects of the command decoder 115 described with reference to FIG. 1. The command decoder 215 is configured for selectively adding a delay to a command directed to the memory device. The command decoder 215 receives various input signals 220 (e.g., signals 220*a* through 220*k*), such as row address strobes (RAS), column address strobes (CAS), write-enable (WE), as well as CMD, ADDR, CS, CK, and CKE described with reference to FIG. 1. In some embodiments, the input signals 220 are related to commands generated by a host device (e.g., a memory module controller, a test equipment) coupled with the memory device. The diagram 200 also illustrates enabling signals coupled to the command decoder 215 (e.g., En_1 235*a*, En_2 235*b*). In some embodiments, the memory device 100 provides the enabling signals, in conjunction with a test mode component (e.g., TM control circuit 175) that manages operations of the memory device 100 under the test modes. In some cases, the memory device 100 provides enabling signals based on operating conditions defined in the mode registers (e.g., the registers 118).

The command decoder 215 may be configured to decode the input signals 220 to identify a command (e.g., Command_1 225*a*, Command_2 225*b*, Command_3 225*c*) directed to the memory device. The decoded command may be bifurcated into two branches in the command decoder 215, namely a first command signal without a delay (e.g., Command_1_ND 225*a*-1) and a second command signal with a delay (e.g., Command_1_YD 225*a*-2). That is, Command_1_ND 225*a*-1 bypasses the delay component 230*a* whereas Command_1_YD 225*a*-2 includes the delay inserted by a delay component (e.g., the delay components 230*a*).

The delay components may be configured to incur a delay to the command (e.g., Command_1 225*a*) when activated by the enabling signals (e.g., En_1 235*a*). In some embodiments, the delay components 230 may include one or more logic components (e.g., a logic gate configured to perform a certain logic function, such as AND, OR, exclusive-OR, or the like) arranged in series such that a variable delay may be programmed to the delay components 230.

The bifurcated command signals (e.g., a command without a delay, the command with a delay) are coupled to a multiplexing component (e.g., multiplexing component 240*a*, which may be referred to as a multiplexor) configured to output one of the bifurcated command signals (e.g., Command_1_ND 225*a*-1, Command_1_YD 225*a*-2) to a command path (e.g., command path 245*a*) based on the status of the enabling signals (e.g., En_1 235*a*).

By way of example, when a test mode is activated for the memory device (e.g., via a test program executed by a tester), the delay components 230 (e.g., delay component 230*a*) may be programmed with a delay—e.g., via the TM control circuit 175. Further, the TM control circuit 175, under the test mode, may activate enabling signals 235 (e.g., En_1 235*a*). Subsequently, when the memory device receives a command directed to the memory device using the input signals 220 (e.g., from the tester), the command decoder 215 may decode the input signals 220 determining that the input signals 220 correspond to Command_1 (e.g., the refresh command). The delay component 230*a*, activated by En_1 235*a*, may incur the delay to the refresh command, which is fed to the multiplexing component 240*a*. Consequently, the multiplexing component 240*a*, activated by En_1 235*a*, outputs the refresh command including the delay into the command path 245*a* for the memory device to execute. That is, the delay programmed in the delay component 230*a* may be added to the refresh command path 245*a* when En_1 235*a* is activated under the test mode.

Such a delay, as described in more detail with reference to FIG. 4, may avoid an instantaneous, large amount of current drawn from a power supply (e.g., a power supply of the tester, a power supply coupled to a memory module including multiple memory devices). In some cases, the delay component 230*a* may be programmed with a zero delay or deactivated when the memory device executes the command (e.g., refresh command) ahead of any other memory devices sharing the power supply—i.e., the memory device is the first one that executes the refresh command.

In some cases, the delay component 230*a* may be programmed with a delay when a test mode for the memory device is not activated. For example, a mode register (e.g., the register 118 described with reference to FIG. 1) of the memory device in an HBM module may have been programmed to indicate that certain commands (e.g., a refresh command) are associated with delays. A particular value of the delay for the delay component 230*a* may have been determined and stored in a nonvolatile memory component of the memory device (e.g., the NVM component 180 described with reference to FIG. 1).

During initialization, the memory device may retrieve the particular value of the delay from the NVM component and program the delay component 230*a* that is associated with the refresh command based on the mode register indication. Further, the enabling signal (e.g., En_1 235*a*) may be activated such that the particular value of the delay in the delay component 230*a* can be added to the refresh command. In this manner, an optimum delay may be determined for a memory device (e.g., while the memory device is being tested under the test mode) and stored in the NVM component, and the optimum delay may be added to certain commands (e.g., refresh command) based on the mode register indication when the memory device operates in a native environment (e.g., within a memory module including the memory device).

As described above, certain enabling signals (e.g., En_1 235*a*) of the memory device may be activated based on two or more operational modes of the memory device—e.g., when a test mode is activated, when a mode register indicates certain commands are associated with delays. In some embodiments, the memory device also includes other enabling signals (e.g., En_2 235*b*) that may be activated based on a single operational mode of the memory device—e.g., when a test mode is activated. That is, delays may be added to certain commands (e.g., Command_2, Command_3) when the test mode of the memory device is activated to enable the delay components 230*b* and 230*c*, as well as the multiplexing components 240*b* and 240*c*.

For example, when the test mode is activated for the memory device, both enabling signals (e.g., En_1 235*a* and En_2 235*b*) may be activated such that delay components 230*a* through 230*c* may be programmed with certain delays (e.g., via a test program executed by a test equipment). The command decoder 215, subsequently, may receive and decode input signals 220 to determine that the memory device has received one of Command_1, Command_2, and Command_3 to execute. As both enabling signals (e.g., En_1 235a and En_2 235b) are activated, the command decoder 215 can add the delays programmed in the delay component 230a, the delay component 230b, and the delay component 230c to Command_1 (e.g., refresh command), Command_2 (e.g., activate command), and Command_3 (e.g., precharge command), respectively.

On the contrary, when the test mode is not activated (e.g., when the memory device operates in a memory module), En_2 235b may not be activated. Thus, the command decoder 215 may not add a delay to Command_2 (e.g., activate command) and/or Command_3 (e.g., precharge command). The mode register of the memory device, however, may be set to indicate that Command_1 (e.g., refresh command) is associated with a delay. Based on the mode register indication, the memory device may activate En_1 235a and retrieve the delay from an NVM component to program the delay component (e.g., delay component 230a) with the delay. When the command decoder 215 receives Command_1 (e.g., refresh command), the command decoder 215 adds the delay programmed in the delay component 230a to Command_1 (e.g., refresh command).

As described in more detail with reference to FIGS. 3 and 4, the delay may be varied (hence variable delays) based on operating environments of the memory device. In some cases, the delay may correspond to zero (i.e., no delay to commands). In some cases, a delay associated with a command (e.g., Command_1) may be different from delays associated with other commands (e.g., Command_2 and/or Command_3). In some cases, a same delay may be added to two or more commands (e.g., Command_1, Command_2, and Command_3).

FIG. 3 shows a block diagram 300 illustrating a scheme of introducing variable delays to a command directed to memory devices in a system in accordance with an embodiment of the present technology. The diagram 300 includes a host device 310, which may be a test equipment configured to test multiple groups of memory devices in parallel or a controller (e.g., a memory controller) for a memory module (e.g., a DIMM, an HBM module) including two or more memory devices. The diagram 300 also illustrates memory groups 315 that each include a plurality of memory devices 320. For example, the memory group 315a includes n memory devices 320a-0 through 320a-(n-1). In some cases, individual memory groups 315 represent sockets of the test equipment that each are configured to test the plurality of memory devices 320 in parallel. The memory devices may be referred to as devices-under-test (DUTs). In some cases, one of the memory groups 315 may represent a memory module (e.g., a DIMM, an HBM module) including the plurality of memory devices 320.

Individual memory devices 320 may be examples of or include aspects of the memory device 100 that includes a delay component 325 (e.g., the delay components 230 described with reference to FIG. 2). Other details of the memory devices 320, such as the command decoder (e.g., the command decoder 215) and associated components (e.g., the multiplexing components 240) and signals (e.g., the input signals 220, the enabling signals 235) described with reference to FIG. 2, are omitted in the diagram 300 for a clear illustration of overall features and principles of the present technology. Further, each memory group 315 is coupled to a power supply 335 that supplies current (and/or voltage) to the memory devices 320 of each memory group 315. For example, the memory group 315a is coupled with the power supply 335a such that individual memory devices 320a within the memory group 315a are connected to the power supply 335a.

In a highly parallel testing environment, one or more test resources may be shared among multiple DUTs so as to increase a quantity of DUTs tested in parallel. Such test resources may include clock pins and/or corresponding channels, command/address (C/A) pins and/or corresponding channels, or the like. The diagram 300 illustrates one or more channels 330 shared by two or more memory groups 315. For example, a set of C/A signals generated by the host device 310 may be shared with the memory groups 315a through 315j via the channels 330. Further, the set of C/A signals are concurrently supplied to all DUTs within a memory group 315—e.g., DUTs 320a-0 through 320a-(n-1) within the memory group 315a concurrently receive the set of C/A signals.

Thus, without the delay components 325 (or variable delays programmed therein), individual DUTs in a memory group (e.g., the memory group 315a) concurrently execute a command (e.g., activate command) included in the set of C/A signals. In some embodiments, individual power supplies 335 may not be capable of supplying a total current required by n DUTs of corresponding memory groups 315, which simultaneously carry out the command (e.g., activate command). As a result, sub-optimal or inaccurate testing of the n DUTs may follow—e.g., testing errors due to unsatisfied timing requirements, erroneously reducing DUT yields by identifying one or more good DUTs as faulty. In some cases, a quantity of DUTs 320 within a memory group 315 may need to be reduced to mitigate the issues related to an instantaneous, large amount of current (or power) demand.

The present technology can mitigate such issues by introducing variable delays to a command arriving at individual DUTs 320 at a same time. Each DUT 320 includes one or more delay components 325 that can be programmed to incur variable delays to the command when a test mode is activated. In this manner, executions of the command by DUTs 320 in a memory group 315 may be staggered in time—e.g., one or more DUTs 320 executing the command at a different time than other DUTs 320. For example, the host device 310 (e.g., a tester in a highly parallel testing environment or a test program run by the tester) may activate (e.g., latch) the test mode of DUTs 320 such that individual DUTs 320 may activate enabling signals (e.g., En_1 235a, En_2 235b). Further, the host device 310 (or DUTs 320 in conjunction with the host device 310) may program the delay components 325 in each DUTs to have a different delay for a command—e.g., the delay component 325a-0 programmed with a delay $\Delta_0$, the delay component 325a-1 programmed with a delay $\Delta_1$, the delay component 325a-2 programmed with a delay $\Delta_2$, and so on.

In this manner, when the DUTs 320 in a memory group 315 (e.g., the memory group 315a) concurrently receive a command (e.g., a precharge command), individual DUTs 320 may execute the command (e.g., the precharge command) at different times pursuant to the delays programmed in the delay components 325. Accordingly, individual DUTs may draw a requisite amount of current from the common power supply (e.g., power supply 335a) at different times such that a total amount of current that the common power supply needs to provide to the DUTs 320 in any given time may remain within a limit of the common power supply.

Still referring to the diagram 300, when the memory devices 320 are assembled into a memory module (e.g., a DIMM, an HBM module), the present technology can also implement variable delays to a command directed to the memory devices 320 utilizing the delay component 325. For example, a memory group (e.g., the memory group 315a) may correspond to an HBM module including a plurality of memory devices 320a (e.g., the memory devices 320a-0 through 320a-(n–1)). Further, the host device 310 may be a memory controller or a processor coupled with the HBM module (e.g., the memory group 315a). Each individual memory device 320a of the HBM module includes the delay components 325 and an NVM component configured to store a delay for the delay component 325.

In some cases, the delays for the memory devices 320 may have been determined while the memory devices 320 are tested. In some cases, the delays may be determined based on configurations of the HBM module—e.g., a quantity of the memory devices 320 in the HBM module, a sequence of memory devices 320 executing a command within the HBM module. Further, the mode registers of the memory devices 320 may be programmed to indicate that the command is associated with the delays. During initialization of the memory devices 320 (e.g., when the HBM module is power up), individual memory devices 320 may activate enabling signals (e.g., En_1 235a) based on the indication programmed in the mode registers. Also, each individual memory device 320 may retrieve a corresponding delay for the command from its NVM component to program the delay component 325 to include the corresponding delay.

When the memory devices 320 in the HBM module concurrently receives a set of C/A signals from the memory controller (e.g., the host device 310) through the channels 330, the memory devices 320 can decode a command (e.g., refresh command) out of the set of C/A signals, and determine that the command is associated with the delays based on the mode register indications. As such, individual memory devices 320 (or some memory devices 320 of the memory group 315) can execute the command (e.g., refresh command) at different times pursuant to the delay programmed in the delay components 325 to the command (e.g., refresh command)—e.g., a staggered execution of the command across different memory devices 320 in their native environment (in the HBM module).

In some embodiments, the memory device 320 may operate in a mode, in which one or more commands (e.g., refresh command, precharge command, activate command) directed to the memory device 320 are associated with a delay. The memory device 320 may determine that a set of signals received from a host device (e.g., signals 220 described with reference to FIG. 2) at the memory device 320 includes at least one of such commands. Subsequently, the memory devices 320 may execute the command after the delay, based on the memory device 320 operating in the mode (i.e., the one or more commands are associated with the delay). In some embodiments, the memory device 320 may set a mode register (e.g., registers 118, registers 507) of the memory device 320 to indicate the mode. Further, the memory device 320 may program a delay component (e.g., delay component 230, delay component 325) of the memory device 320 with the delay such that the delay component may hold the command from execution until the delay expires.

FIG. 4 shows a timing diagram 400 illustrating a scheme of introducing variable delays to a command directed to memory devices in a system in accordance with an embodiment of the present technology. The diagram 400 depicts various signals and/or activities of the memory devices 320 of the diagram 300 described with reference to FIG. 3. The diagram 400 includes a waveform 410 corresponding to a command received at a memory group (e.g., the memory group 315a) that includes a plurality of memory devices (e.g., the memory devices 320a). In some cases, the waveform 410 may represent a voltage at a C/A pin coupled to the memory group 315, which in turn, connected to the plurality of memory devices 320, when a set of C/A signals via the channels 330 arrives at the memory group 315.

The diagram 400 also illustrates waveforms 415 (e.g., waveforms 415a-0 through 415a-(n–1)) associated with corresponding memory devices (e.g., DUTs or memory devices 320a-0 through 320a-(n–1) in the memory group 315a). The waveforms 415 symbolically represent time periods, during which the corresponding memory devices may perform various operations associated with the command and may not correspond to any particular voltage or current levels of a particular pin of the memory devices 320. For example, an upward transition in the waveforms 415 may represent the memory device initiating a first operation in response to receiving the command, and a downward transition in the waveforms 415 may represent the memory device completing a last operation associated with the command. That is, a duration between the upward transition and the downward transition in the waveform 415 may correspond to a time period, during which the memory device 320 is active to carry out the command.

Further, the diagram 400 depicts waveforms 420 (e.g., waveforms 420a-0 through 420a-(n–1)) associated with corresponding memory devices (e.g., memory devices 320a-1 through 320a-(n–1)). In some cases, the waveforms 420 correspond to an amount of current that the memory devices 320 draw from a common power source (e.g., the power supply 335) while carrying out the command. Waveforms 415 includes peak currents I (e.g., peak currents $I_0$ through $I_{n-1}$), which may occur during one or more phases of carrying out the command. For example, an activate command may require the memory device 320 to bring a voltage of a word line of a memory array to a target value. In some cases, the word line may be coupled with a large quantity of memory cells (e.g., 1,024 memory cells) and extends to a substantial distance. Thus, bringing up the voltage of the word line may result in the peak current I drawn from the power source due to intrinsic and/or parasitic capacitances associated with the word line, in some cases. Once the word line establishes the target voltage value, the memory device 320 may carry on subsequent phases of the activate command, which may not draw as much current as the peak current I.

The diagram 400 illustrates variable delays (e.g., $\Delta_0$ through $\Delta_{n-1}$) added to the command when individual memory devices 320 carry out the command. The variable delays may be devised such that the peak currents I required by the individual memory devices 320 can be distributed in time. In this manner, issues associated with limitations of the power source (e.g., the power supply 335a not being able to supply an instantaneous, large amount of current) may be mitigated.

By way of example, the waveform 415a-0 may represent the memory device 320a-0 initiating operations without a delay when the memory device 320a-0 receives the command (e.g., an activate command) at time $T_0$—e.g., $\Delta_0$ corresponding to zero with respect to $T_0$. Thereafter, the peak current $I_0$ follows after $T_0$ as indicated in the waveform 420a-0. In this regard, the memory device 320a-0 may be the first memory device that executes the command (e.g., the activate command) than any other memory devices (e.g., memory device 320a-1 through 320a-(n–1)). In some cases, when a memory device is one of the memory devices of a memory group that execute the command ahead of other memory devices of the memory group, a delay component of the memory device may be deactivated so as not to incur a delay (e.g., equivalent to having $\Delta_0$ corresponding to zero).

Similarly, the waveform 415a-1 may represent the memory device 320a-1 initiating operations at time $T_1$ after a delay (e.g., $\Delta_1$ corresponding to a duration greater than zero) with respect to the time $T_0$—e.g., $\Delta_1$ corresponding to a non-zero value with respect to $T_0$. Thereafter, the peak current $I_1$ follows after $T_1$ as indicated in the waveform 420a-1. That is, the memory device 320a-1 executes the command after the duration (e.g., the duration corresponding to the delay $\Delta_1$) elapsed. In this manner, the command (e.g., the activate command) may be staggered (e.g., distributed) in time by introducing variable delays to the command such that the power source may not need to support two or more peak currents that two or more memory devices 320 require at any given time when executing the command (e.g., the activate command).

As described herein, a host device may provide the variable delays for certain commands (e.g., activate commands, precharge commands, refresh commands) to the memory devices 320 so that individual memory devices 320 may, in turn, program corresponding delay components 325 pursuant to the variable delays for the commands. For example, a test equipment in a parallel testing environment may activate the test mode for the memory devices 320a of the memory group 310a and provide variable delays aimed for a command (e.g., an activate command)—e.g., $\Delta_0$ corresponding to 0 nsec, $\Delta_1$ corresponding to 25 nsec, $\Delta_2$ corresponding to 50 nsec, and so on—such that the memory devices 320a can program corresponding delay components 325a, accordingly. Thereafter, when the memory group 315a receives the command (e.g., the activate command) at time $T_0$, the memory device 320a-0 executes the command without a delay (e.g., $\Delta_0$ corresponding to 0 nsec), the memory device 320a-1 executes the command 25 nsec after $T_0$ (e.g., $\Delta_1$ corresponding to 25 nsec), the memory device 320a-2 executes the command 50 nsec after $T_0$ (e.g., $\Delta_2$ corresponding to 50 nsec), and so on.

As described herein, variable delays for certain commands (e.g., refresh command) maybe stored in NVM components (e.g., the NVM component 180) of the memory devices 320 of a memory module (e.g., a DIMM and/or HBM module delivered to an end-user). Further, mode registers (e.g., registers 118) of the memory devices 320 may be set to indicate that the commands are associated with the variable delays stored in the NVM components—i.e., the memory devices 320 may store operation modes of certain commands. Accordingly, the memory devices 320 may program the corresponding delay components (e.g., delay component 230a configured to incur the delay to refresh command) based on the variable delays stored in their NVM components—e.g., as part of initialization procedures for the memory devices 320, in some cases.

For example, based on the variable delays stored in their NVM components, the memory device 320a-0 may be programmed to execute one of such commands (e.g., refresh command) without any delay (e.g., $\Delta_0$ corresponding to 0 nsec), the memory device 320a-1 may be programmed to execute the command after 25 nsec (e.g., $\Delta_1$ corresponding to 25 nsec), the memory device 320a-2 may be programmed to execute the command after 50 nsec (e.g., $\Delta_2$ corresponding to 50 nsec), and so on. In this manner, when a memory controller for the memory module, which may be agnostic to the variable delays programmed in the delay components, issues one of such commands (e.g., refresh command) to the memory module, the individual memory devices in the memory module execute the command (e.g., refresh command) based on the corresponding variable delays programmed in the delay components—e.g., the memory device 320a-1 executing the refresh command after 25 nsec since receiving the command (e.g., $\Delta_1$ corresponding to 25 nsec), the memory device 320a-2 executing the refresh command after 50 nsec since receiving the command (e.g., $\Delta_2$ corresponding to 50 nsec), and so on.

Variable delays may be determined based on several factors, such as current delivery capability of a power supply 335 coupled with a memory group 315 including a plurality of memory devices 320, timings of the peak current occurrences and/or magnitudes of the peak currents that may be different for different commands, natures of the commands that may or may not allow introducing delays, among others. For example, when a power supply is capable of supplying a sum of three (3) peak currents for a command (e.g., precharge command) at any given time, groups of three (3) delays may be implemented—e.g., a first set of three (3) memory devices executing a precharge command with $\Delta_0$ corresponding to 0 nsec, a second set of three (3) memory device executing the precharge command with $\Delta_1$ corresponding to 25 nsec, and so on. In such examples, a particular number of memory devices in the first set and/or the second set having a same delay may differ based on a magnitude of the peak current of a command—e.g., an activate command may include a greater peak current than the precharge command, which may necessitates reducing the number of memory devices in each set (e.g., two (2) memory devices, instead of three (3)).

In some cases, delays may be different for different commands. For example, a precharge command may trigger a sequence of $\Delta_0$ corresponding to 0 nsec, $\Delta_1$ corresponding to 25 nsec, $\Delta_2$ corresponding to 50 nsec, and so on, whereas a refresh command (which may include a peak current that occurs at a later timing than that of the precharge command) may trigger a different sequence of delays, e.g., $\Delta_0$ corresponding to 0 nsec, $\Delta_1$ corresponding to 40 nsec, $\Delta_2$ corresponding to 80 nsec, and so on. Additionally or alternatively, some commands may be configured to include the variable delays in both test environments and end-user environments (e.g., a refresh command, for which memory devices 320 may have some flexibility as to when to execute the refresh command based on a history of previous refresh commands). In contrast, certain commands may include the variable delays in test environments only (e.g., activate command and/or precharge command that typically precede read and/or write commands) because the memory devices are required to meet certain speed and/or bandwidth requirements that a host device expects.

Several embodiments of the present technology are directed to adding variable delays to certain commands directed to memory devices, but the present technology is not limited thereto. For example, DUTs illustrated in FIG. 3 may include other types of semiconductor devices, such as processors, micro-controllers, application-specific integrated circuits (ASICs), among others. Further, FIG. 2 illustrates a delay component associated with a command (e.g., the delay component 230a associated with Command_1 225a, the delay component 230b associated with Command_2 225b, and so on), but in some embodiments, a delay component may be configured to add a delay to two or more commands.

Figure 5:
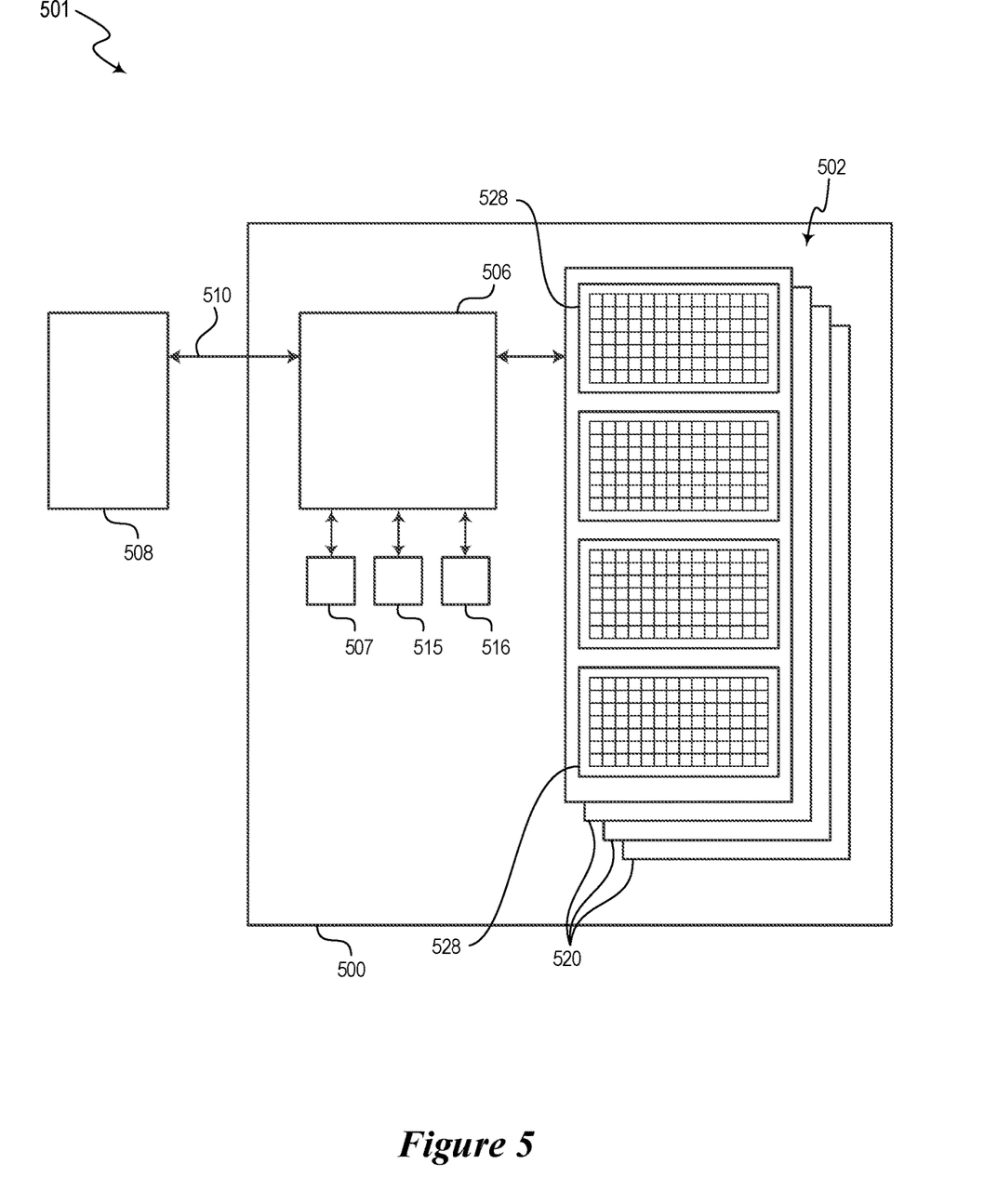
FIG. 5 is a block diagram schematically illustrating a memory system in accordance with an embodiment of the present technology.

FIG. 5 is a block diagram of a system 501 having one or more memory device 500 configured in accordance with an embodiment of the present technology. The memory device 500 may be an example of or include aspects of the memory devices 100 described with reference to FIG. 1. As shown, the memory device 500 includes a main memory 502 (e.g., DRAM, NAND flash, NOR flash, FeRAM, PCM, etc.) and control circuitry 506 operably coupled to a host device 508 (e.g., an upstream central processor (CPU)). The main memory 502 may be an example or include aspects of the memory array 150 described with reference to FIG. 1. Further, the control circuitry 506 include aspects of various components described with reference to FIG. 1. For example, the control circuitry 506 may include aspects of the command/address input circuit 105, the command decoder 115, and the TM control circuit 175, among others.

The main memory 502 includes a plurality of memory units 520, which each include a plurality of memory cells. The memory units 520 can be individual memory dies, memory planes in a single memory die, a stack of memory dies vertically connected with through-silicon vias (TSVs), or the like. For example, in one embodiment, each of the memory units 520 can be formed from a semiconductor die and arranged with other memory unit dies in a single device package. In other embodiments, multiple memory units 520 can be co-located on a single die and/or distributed across multiple device packages. The memory units 520 may, in some embodiments, also be sub-divided into memory regions 528 (e.g., banks, ranks, channels, blocks, pages, etc.).

The memory cells can include, for example, floating gate, charge trap, phase change, capacitive, ferroelectric, magnetoresistive, and/or other suitable storage elements configured to store data persistently or semi-persistently. The main memory 502 and/or the individual memory units 520 can also include other circuit components, such as multiplexers, decoders, buffers, read/write drivers, address registers, data out/data in registers, etc., for accessing and/or programming (e.g., writing) the memory cells and other function, such as for processing information and/or communicating with the control circuitry 506 or the host device 508. Although shown in the illustrated embodiments with a certain number of memory cells, rows, columns, regions, and memory units for purposes of illustration, the number of memory cells, rows, columns, regions, and memory units can vary, and can, in other embodiments, be larger or smaller in scale than shown in the illustrated examples. For example, in some embodiments, the memory device 500 can include only one memory unit 520. Alternatively, the memory device 500 can include two, three, four, eight, ten, or more (e.g., 16, 32, 64, or more) memory units 520. Although the memory units 520 are shown in FIG. 5 as including four memory regions 528 each, in other embodiments, each memory unit 520 can include one, two, three, eight, or more (e.g., 16, 32, 64, 100, 128, 256, or more) memory regions.

In some embodiments, the memory device 500 may include a register 507 (which may also be referred to as a mode register) that may be configured to store an operation mode of a command directed to the main memory 502. The register 507 may be an example of or include aspects of the register 118 described with reference to FIG. 1. The operation mode may indicate that the command is associated with a delay—e.g., a refresh command associated with a delay $\Delta_2$. In some cases, the register 507 may be set (e.g., by programming one or more bits of the register 507) to indicate that the delay may be added to the command such that the command may be executed after the delay. In some embodiments, the memory device 500 may also include a delay component 515, which may be an example of or include aspects of the delay component 230 and/or the delay component 325 described with reference to FIGS. 2 and 3. The delay component 515 may be configured to hold the command from execution until the delay expires. As such, storing the operation mode of the command may be based on programming the delay component 515 to include the delay.

In some embodiments, the memory device 500 may also include an NVM component 516, which may be an example of or include aspects of the NVM component 180. In some cases, the NVM component includes an array of fuses (or anti-fuses) configured to store various information for the memory device 500 when the memory device 500 is disconnected from a power source. In some cases, the delay may be stored in the NVM component 516. The memory device 500 (in conjunction with the 506) may retrieve the delay from the NVM component 516 based on the operation mode of the command such that the memory device 500 can program the delay component 325 with the delay. Subsequently, when the memory device 500 receives the command, the memory device 500 may perform the command after the delay that has been programmed in the delay component 325 expires.

In some embodiments, the memory device 500 may be part of a set of memory devices (not shown in FIG. 5) of a multi-chip module (e.g., an HBM module). In some cases, the delay may be a duration greater than zero (e.g., 25 nsec, 50 nsec, 75 nsec, etc.) when the memory device 500 executes the command after one or more memory devices of the set execute the command. In some cases, the delay may be different from another delay stored in at least one memory device of the set—e.g., a staggered execution of the command in time among the set of memory devices. When the memory device executes the command ahead of other memory device of the set, the delay may correspond to zero (e.g., no delay), in some cases. Further, when the memory device executes the command ahead of other memory device of the set, the delay component 515 may be deactivated such that no delay may be added to the command.

In one embodiment, the control circuitry 506 can be provided on the same die as the main memory 502 (e.g., including command/address/clock input circuitry, decoders, voltage and timing generators, input/output circuitry, etc.). In another embodiment, the control circuitry 506 can be a microcontroller, special purpose logic circuitry (e.g., a field programmable gate array (FPGA), an application specific integrated circuit (ASIC), control circuitry on a memory die, etc.), or other suitable processor. In one embodiment, the control circuitry 506 can include a processor configured to execute instructions stored in memory to perform various processes, logic flows, and routines for controlling operation of the memory device 500, including managing the main memory 502 and handling communications between the memory device 500 and the host device 508. In some embodiments, the control circuitry 506 can include embedded memory with memory registers for storing, e.g., row counters, bank counters, memory pointers, fetched data, etc. In another embodiment of the present technology, a memory device 500 may not include control circuitry, and may instead rely upon external control (e.g., provided by the host device 508, or by a processor or controller separate from the memory device 500).

The host device 508 can be any one of a number of electronic devices capable of utilizing memory for the temporary or persistent storage of information, or a component thereof. For example, the host device 508 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 508 may be a networking device (e.g., a switch, a router, etc.) or a recorder of digital images, audio and/or video, a vehicle, an appliance, a toy, or any one of a number of other products. In one embodiment, the host device 508 may be connected directly to memory device 500, although in other embodiments, the host device 508 may be indirectly connected to memory device (e.g., over a networked connection or through intermediary devices).

In operation, the control circuitry 506 can directly write or otherwise program (e.g., erase) the various memory regions of the main memory 502. The control circuitry 506 communicates with the host device 508 over a host-device bus or interface 510. In some embodiments, the host device 508 and the control circuitry 506 can communicate over a dedicated memory bus (e.g., a DRAM bus). In other embodiments, the host device 508 and the control circuitry 506 can communicate over a serial interface, such as a serial attached SCSI (SAS), a serial AT attachment (SATA) interface, a peripheral component interconnect express (PCIe), or other suitable interface (e.g., a parallel interface). The host device 508 can send various requests (in the form of, e.g., a packet or stream of packets) to the control circuitry 506. A request can include a command to read, write, erase, return information, and/or to perform a particular operation (e.g., a refresh operation, a TRIM operation, a precharge operation, an activate operation, a wear-leveling operation, a garbage collection operation, etc.). In some cases, a set of signals (e.g., signals from command/address (C/A) pins and/or corresponding channels) may be used to transmit such a command, and the control circuitry 506 may decode (e.g., using the command decoders 115 or 215) the set of signals to determine which command that the memory device 500 has received.

Figure 6:
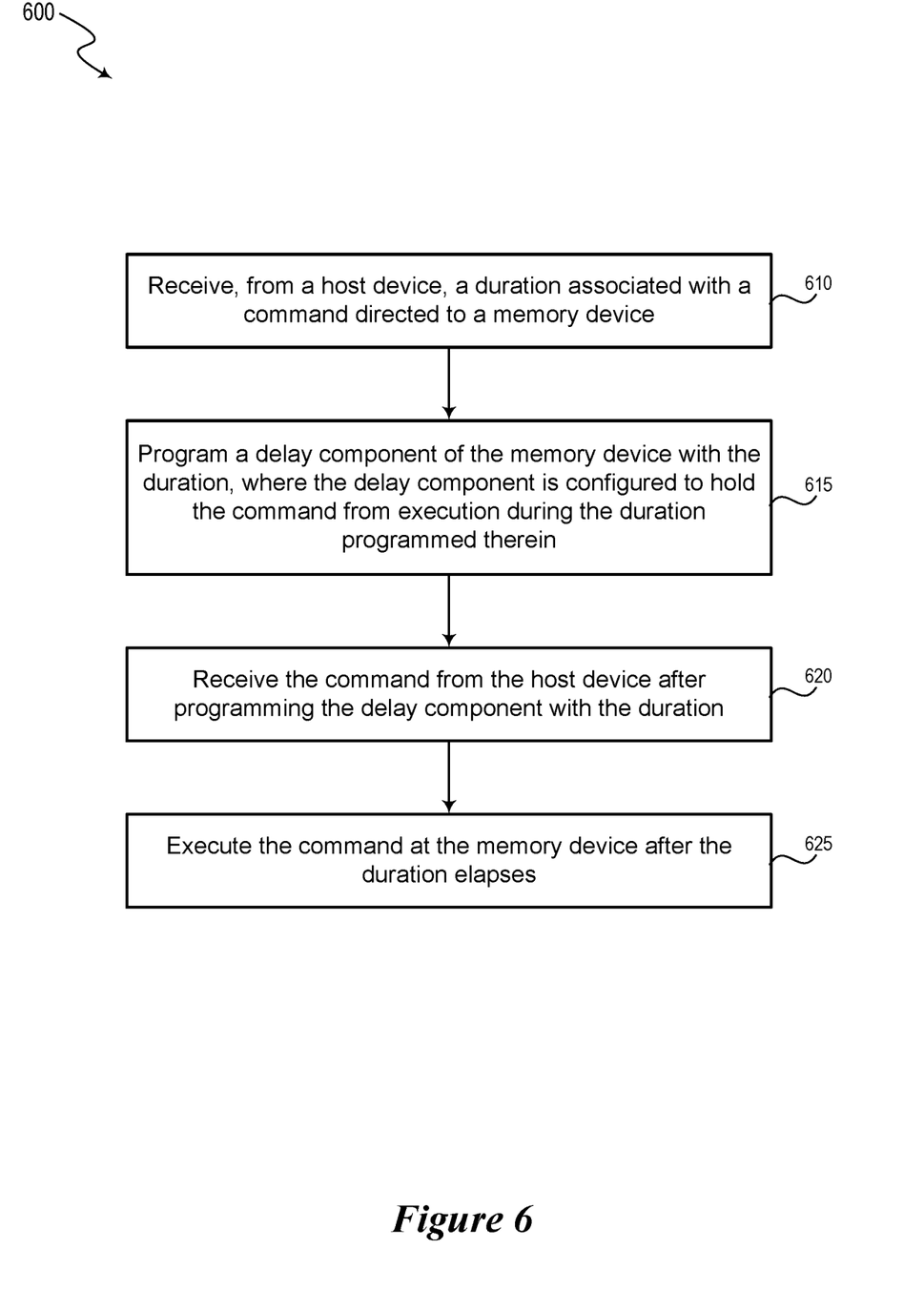
FIGS. 6 and 7 are flowcharts illustrating methods of operating a memory device in accordance with an embodiment of the present technology.

FIG. 6 is a flow chart 600 illustrating a method of operating a memory device in accordance with an embodiment of the present technology. The flow chart 600 may be an example of or include aspects of a method that the memory device 100 (e.g., the command/address input circuit 105, the command decoder 115, the TM control circuit 175, or a combination thereof) and/or the memory device 500 (e.g., the control circuitry 506 of the memory device 500) may perform as described with reference to FIGS. 1 through 5.

The method includes receiving, from a host device, a duration associated with a command directed to a memory device (box 610). In accordance with one aspect of the present technology, the receiving feature of box 610 can be performed by a control circuitry (e.g., the control circuitry 506 of FIG. 5) or a command/address input circuit (the command/address input circuit 105 of FIG. 5) as described with reference to FIGS. 1 and 5.

The method further includes programming a delay component of the memory device with the duration, where the delay component is configured to hold the command from execution during the duration programmed therein (box 615). In accordance with one aspect of the present technology, the programming feature of box 615 can be performed by the control circuitry (e.g., the control circuitry 506 of FIG. 5) or a command decoder (the command decoder 115 of FIG. 1) and/or a test mode control circuit (e.g., the test mode control circuit 175 of FIG. 1) as described with reference to FIGS. 1 and 5.

The method further includes receiving the command from the host device after programming the delay component with the duration (box 620). In accordance with one aspect of the present technology, the receiving feature of box 620 can be performed by the control circuitry (e.g., the control circuitry 506 of FIG. 5) or the command/address input circuit (the command/address input circuit 105 of FIG. 5) as described with reference to FIGS. 1 and 5.

The method further includes executing the command at the memory device after the duration elapses (box 620). In accordance with one aspect of the present technology, the executing feature of box 620 can be performed by the control circuitry (e.g., the control circuitry 506 of FIG. 5) or the command decoder (the command decoder 115 of FIG. 1), in conjunction with the address decoder 110 and/or the row decoder 140 of FIG. 1, in some cases, as described with reference to FIGS. 1 and 5.

In some embodiments, a set of memory devices includes the memory device, and individual memory devices of the set are coupled to a common power supply (e.g., the power supply 335 of FIG. 3) and configured to concurrently receive the command. In some embodiments, the method can further include deactivating the delay component when the memory device is one of the memory devices of the set that execute the command ahead of other memory devices of the set. In some embodiments, the duration is different from one or more durations associated with the command directed to one or more other memory devices of the set. In some embodiments, delay components of individual memory devices of the set are programmed with corresponding durations that are different from each other, where the corresponding durations are directed to the command.

Figure 7:
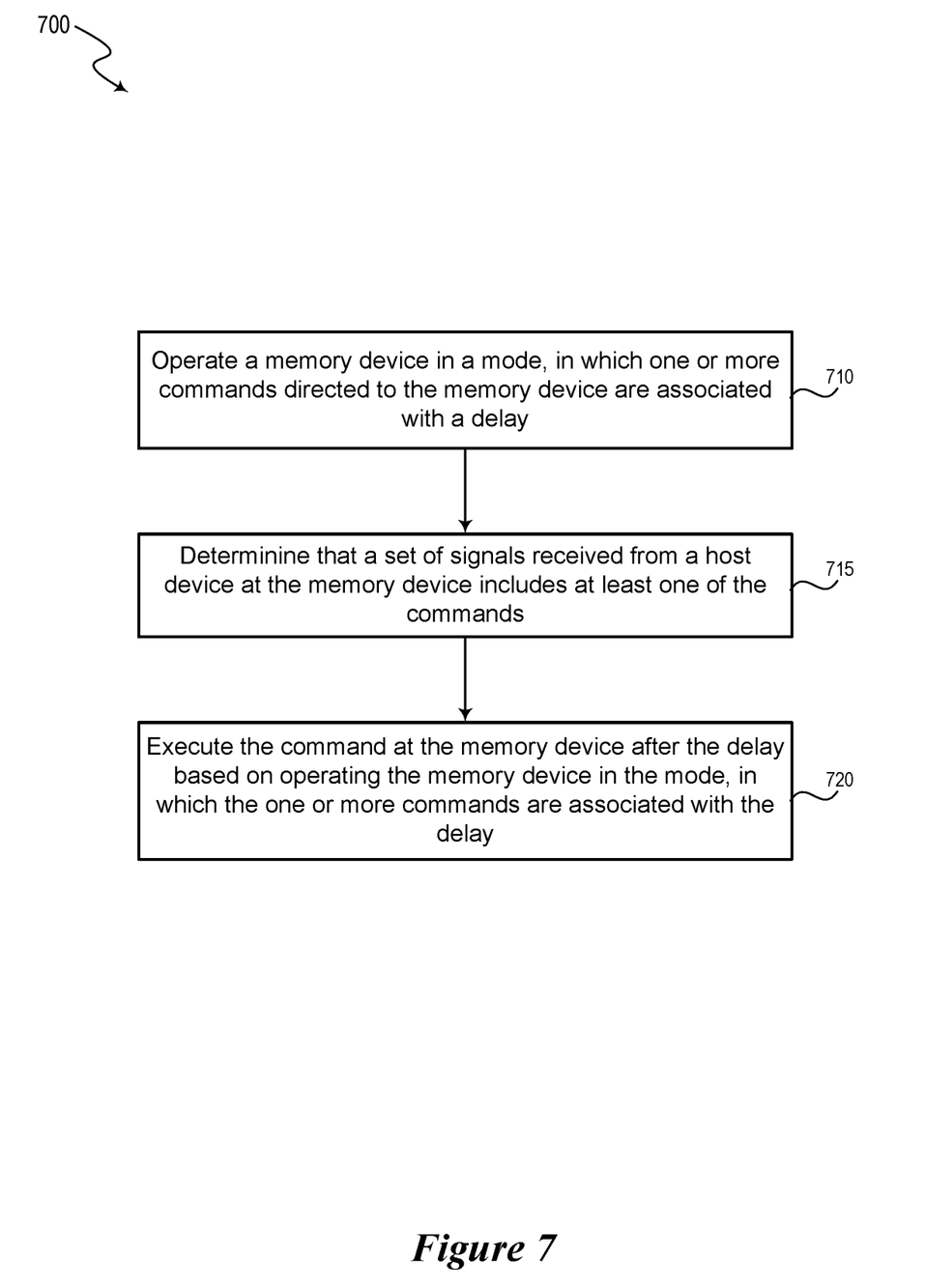

FIG. 7 is a flow chart 700 illustrating a method of operating a memory device in accordance with an embodiment of the present technology. The flow chart 700 may be an example of or include aspects of a method that the memory device 100 (e.g., the command/address input circuit 105, the command decoder 115, the TM control circuit 175, or a combination thereof) and/or the memory device 500 (e.g., the control circuitry 506 of the memory device 500) may perform as described with reference to FIGS. 1 through 5.

The method includes operating a memory device in a mode, in which one or more commands directed to the memory device are associated with a delay (box 710). In accordance with one aspect of the present technology, the operating feature of box 710 can be performed by a control circuitry (e.g., the control circuitry 506 of FIG. 5) or a command decoder (e.g., the command decoder 115 of FIG. 1, the command decoder 215 of FIG. 2) and/or a test mode control circuit (e.g., the test mode control circuit 175 of FIG. 1) as described with reference to FIGS. 1 and 5.

The method further includes determining that a set of signals received from a host device at the memory device includes at least one of the commands (box 715). In accordance with one aspect of the present technology, the determining feature of box 715 can be performed by the control circuitry (e.g., the control circuitry 506 of FIG. 5) or the command decoder (e.g., the command decoder 115 of FIG. 1, the command decoder 215 of FIG. 2) as described with reference to FIGS. 1 and 5.

The method further includes executing the command at the memory device after the delay based at least in part on operating the memory device in the mode, in which the one or more commands are associated with the delay (box 720). In accordance with one aspect of the present technology, the executing feature of box 720 can be performed by the control circuitry (e.g., the control circuitry 506 of FIG. 5) or the command decoder (e.g., the command decoder 115 of FIG. 1, the command decoder 215 of FIG. 2), in conjunction with the address decoder 110 and/or the row decoder 140 of FIG. 1, in some cases, as described with reference to FIGS. 1 and 5.

In some embodiments, the method can further include setting a mode register of the memory device to indicate the mode, in which the one or more commands are associated with the delay. In some embodiments, the method can further include programming a delay component of the memory device with the delay, the delay component configured to hold the command from execution until the delay expires. In some embodiments, the memory device is included in a set of memory devices of a multi-chip module, and the delay corresponds to a duration greater than zero when the memory device executes the command after one or more memory devices of the set execute the command. In some embodiments, the memory device is included in a set of memory devices of a multi-chip module, and the delay is different from another delay stored in at least one memory device of the set.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method, comprising:
setting a mode register of a memory device to indicate a mode, in which one or more commands are associated with a delay;
operating the memory device in the mode, in which the one or more commands directed to the memory device are associated with the delay;
determining that a set of signals received from a host device at the memory device includes at least one of the commands; and
executing the command at the memory device after the delay based at least in part on operating the memory device in the mode, in which the one or more commands are associated with the delay.

2. The method of claim 1, further comprising:
programming a delay component of the memory device with the delay, the delay component configured to hold the command from execution until the delay expires.

3. The method of claim 1, wherein the memory device is included in a plurality of memory devices of a multi-chip module, and wherein the delay corresponds to a duration greater than zero when the memory device executes the command after one or more memory devices of the plurality execute the command.

4. The method of claim 1, wherein the memory device is included in a plurality of memory devices of a multi-chip module, and wherein the delay is different from another delay stored in at least one memory device of the plurality.

5. An apparatus, comprising:
a controller associated with a memory array, wherein the controller is configured to cause the apparatus to:
set a mode register of the apparatus to indicate a mode, in which one or more commands are associated with a delay;
operate in the mode, in which the one or more commands directed to the apparatus are associated with the delay;
determine that a set of signals received from a host device at the apparatus includes at least one of the commands; and
execute the command at the apparatus after the delay based at least in part on operating the apparatus in the mode, in which the one or more commands are associated with the delay.

6. The apparatus of claim 5, wherein the controller is further configured to cause the apparatus to:
   program a delay component of the apparatus with the delay, the delay component configured to hold the command from execution until the delay expires.

7. The apparatus of claim 5, wherein the apparatus is a memory device included in a plurality of memory devices of a multi-chip module, and wherein the delay corresponds to a duration greater than zero when the memory device executes the command after one or more memory devices of the plurality execute the command.

8. The apparatus of claim 5, wherein the apparatus is a memory device included in a plurality of memory devices of a multi-chip module, and wherein the delay is different from another delay stored in at least one memory device of the plurality.

\* \* \* \* \*